United States Patent [19]
Muri et al.

[11] Patent Number: 5,240,001
[45] Date of Patent: Aug. 31, 1993

[54] METHOD FOR DETERMINING MOVING MATERIAL IN A BODY

[75] Inventors: Marcel Muri, Ruschlikon, Switzerland; Jurgen Hennig, Freiburg, Fed. Rep. of Germany; Peter Brunner, Bruttisellen, Switzerland

[73] Assignee: Spectrospin AG, Zurich, Switzerland

[21] Appl. No.: 616,034

[22] Filed: Nov. 20, 1990

Related U.S. Application Data

[63] Continuation of Ser. No. 84,597, Aug. 12, 1987, abandoned.

[51] Int. Cl.$^5$ ............................................. A61B 5/055
[52] U.S. Cl. .................... 128/653.3; 324/306
[58] Field of Search ............... 128/653 A, 653 AF; 324/306, 309

[56] References Cited

U.S. PATENT DOCUMENTS

4,714,081 12/1987 Dumgulin et al. ................. 128/653

Primary Examiner—Ruth S. Smith
Attorney, Agent, or Firm—Pennie & Edmonds

[57] ABSTRACT

For determining flowing material within a body by NMR tomography, a disk-shaped area in the body is excited, whereafter one applies a flow phase gradient directed in the same sense as the selection gradient (1) and comprising two successive, inversely identical sections (3,4) whose values are varied for the successive excitations. The echo signals obtained, which originate substantially from moving material, are received at a reading gradient directed perpendicularly to the selection gradient. 2DFT reconstruction of a set of spin echo signals furnishes an image which contains the spatial coordinate of the reading gradient in one direction and the flow speed of the material flowing in a direction perpendicular to the excited area in the second direction.

10 Claims, 6 Drawing Sheets

METHOD FOR DETERMINING MOVING MATERIAL IN A BODY

This is a continuation of application Ser. No. 07/084,597 filed Aug. 12, 1987, abandoned.

The present invention relates to a method for determining moving material, in particular flowing material, in a body by NMR tomography, comprising the steps of exposing the body to a homogeneous magnetic field and pulsating gradient fields applied in periodic succession, as well as to rf excitation pulses synchronized in time to the said gradient fields, and varying the gradient fields in such a manner that the spins occurring in a selected area of a body are excited during every measuring sequence triggered by an rf excitation pulse and caused to generate spin echo signals, and subjecting a set of the spin echo signals received during the measuring sequences to fourier transformation to obtain not only a three-dimensional resolution of the selected area, but also information on the speed of the moving material present in that area.

A method of this type has been described by D. A. Fineberg et al in Magn. Reson. in Med. 2, 555 (1985). In the case of this known method, flow coding gradients extending in parallel to the reading direction and also to the direction of one disk-selecting gradient are applied in combination with an rf pulse sequence which excites the spin echo signals by a 90° excitation pulse and a subsequent 180° reversing pulse.

However, it is a drawback of this known method that the moving, in particular flowing, material furnishes a very feeble signal only because during the whole set of usually 128 or 256 measuring sequences, the moving material coded in the reading direction is exposed to rf pulses generating the signals several times, and is saturated thereby. If such saturation is to be avoided, long repetition times are required which exclude the use of the method as a 3DFG method since in this case the necessary measuring times would be in the range of several hours. Such measuring times would, however, be unacceptable in particular when the method is used for clinical examinations of a human body. In addition, movements of the body would be unavoidable during such a long measuring time, and such movements would lead to errors likely to question the success of the measurements altogether.

Another disadvantage results from the fact that material flowing in the direction of the disk gradient is not exposed to its full extent to the component of the measuring sequence serving to generate the signal as it may have moved out of the disk under examination, either fully or partly, during the time interval between the 90° pulse and the 180° pulse. The seriousness of this effect rises as the flow speed increases. This phenomenon contributes still further towards reducing the signal yield which strongly impairs the usefulness of the method for clinical use.

The general theory underlying the method according to the invention has been discussed in a paper by P. R. Moran in Magn. Reson. Imaging 1, 197 (1982). According to this theory, it is possible to generate a six-dimensional image. Of the six dimensions, three are assigned to the representation of the image content, related to three spatial axes, while the other three are assigned to the representation of flow speeds along the said spatial axes. While such an image is too complicated for practical use, simpler and useful images can be generated by limiting the number of dimensions. In any case, however, the flow speed is always measured at least in the direction of the reading gradient. Accordingly, the methods known from this publication also present the disadvantage mentioned above, namely that undesirable saturation occurs unless very long repetition times are adhered to, which is not possible in many application. The same applies also to the method known from the paper by T. W. Redpath et al. in Phys. Med. Biol. 29 (7), 891 (1984).

Now, it is the object of the present invention to optimize a method of the type described above in such a manner that measurements can be carried out with short repetition times for the individual measuring sequences, without regard to a possible saturation, and will still furnish a clear signal that can be well evaluated.

According to the invention, this object is achieved by a method comprising the steps of exciting a disk-shaped area of the body by an rf pulse during application of a selection gradient, applying thereafter a flow phase gradient directed in the same direction as the selection gradient and comprising two successive, inversely identical sections, the value of the said sections being varied for successive excitations, and applying a reading gradient directed perpendicularly to the selection gradient and being preceded by an oppositely directed gradient pulse which is applied between the two sections of the flow phase gradient and which, together with the reading gradient, causes an echo signal to be generated so that 2DFT reconstruction of a set of signals furnishes an image which in one direction contains the spatial coordinate of the reading gradient while in the second direction it contains the flow speed of the material flowing perpendicularly to the disk.

Accordingly, the method of the invention provides an image which shows, above a spatial coordinate extending in the plane of the disk, the flow speed of flowing material present in a section of the excited, disk-shaped area projected upon this spatial coordinate. Such an image will frequently suffice to relate the flow speeds that have been determined in this manner to vessels, for example veins, in a body cross-section. Thus, it is possible in this manner with only one signal set of measuring sequences to obtain clear information regarding the moving material present in an excited disk-shaped area, and its flow speed. At the same time, the signals received have a favorable signal-to-noise ratio. Another advantage of this method is seen in the fact that only a single rf pulse is required for excitation so that the whole material present in the disk-shaped area is exposed to the signal-generating sequence and contributes, accordingly, to the output signal.

The saturation of the stationary material and, accordingly, the signal-to-noise ratio can be further improved if the excitations required for generating a signal set follow each other so rapidly that when an rf excitation pulse is applied, the excitation effected by the preceding measuring sequence has not phased out yet. In this case, the stationary material of the excited disk-shaped material cannot contribute at all to the output signal which is subjected to 2DFT reconstruction as mentioned before. In this case, only spins originating from moving material that entered the saturated area newly and is excited for the first time during the last measuring sequence, can be excited coherently and furnish a signal.

In the event sufficiently rapid repetition of the individual measuring sequences should not be possible easily for some reason or other, complete saturation of the stationary material can also be achieved easily by exposing the body, after the first rf pulse, to a rapidly varying gradient field which achieves at least nearly complete saturation of the excited area by dephasing the excited spins. After a certain period of time, another rf pulse is then applied for exciting the moving material that entered the previously saturated area after the first rf pulse and which then furnishes the spin echo signals.

The method according to the invention is also particularly well suited for examining pulsating material because the excitation triggering the measuring signal is effected by a single rf pulse and, accordingly, at an exactly defined point in time. According to a further improvement of the invention the latter, therefore, provides the possibility to trigger the rf pulses in synchronism with the period of the pulsating material flow so as to carry out each measurement at an exactly defined moment within the period of the pulsating material flow. In this manner, it is possible in particular to examine the development in time of the flow speed of blood in the veins of a human or animal body as a function of the pulsation, by triggering the measuring sequences by an ECG and carrying out the measurement at different intervals from the triggering pulse of the ECG. It would also be possible in this case to trigger several such measuring sequences excited by rf pulses during each period of the pulsating material flow, without varying the flow phase gradient, and to form the sets for 2DFT reconstruction from those spin echo signals which originate from the same measuring sequence within the periods of the pulsating material flow. One obtains in this manner a series of flow profile images following each other in time, or a time series of speed diagrams showing the development in time of the flow speed of the blood between two pulsations.

As mentioned before, the embodiments of the method according to the invention described above furnish information on the flow speed of moving material passing transversely through the excited disk-shaped area, above a coordinate extending in the plane of this area. In the event the projection of the area upon this coordinate should not suffice to permit the individual flow speed profiles to be related to the points of the disk-shaped area where the moving material is located, it is of course also possible—as is generally known from NMR tomography—to pick up several signal sets using reading gradients of different directions, and derive from the signals so obtained an image of the excited disk-shaped area. Generally, only a few signal sets will suffice to give a rough "quick image" of the disk-shaped area, which will, however, be satisfactory as a reference image for the purpose of relating the flow profiles clearly to those points of the disk-shaped areas where flowing material is encountered. This usual technique may of course be refined at desire by increasing the number of signal sets employed. Instead of proceeding in this manner it would, however, also be possible to expose the body to a spatial phase gradient, following excitation by an rf pulse, preferably in the interval between the sections of the flow phase gradient, in a direction perpendicular to the direction of the selection gradient and different from, preferably also perpendicular to, the direction of the reading gradient, to vary the value of the spatial phase gradient after each complete set of measuring sequences resulting from the variation of the flow phase gradient, and to subject the spin echo signals so received thereafter to an additional 3DFT reconstruction so that a two-dimensional image is obtained to which the flow speeds are related in the third dimension.

However, a spatial phase gradient can be used not only for producing a two-dimensional image to which the flow speeds are related in the third dimension; rather, such a phase gradient which in this case is given a constant value, may also contribute to the dephasing effect and, accordingly, help suppress the signals of large-area structures.

Finally, the method according to the invention offers the possibility to generate several sets of spin echo signals for several parallel disks and to process these sets for generating a three-dimensional image of the flow behavior over a certain length of the body under examination.

The invention will now be described in greater detail with reference to the embodiments shown in the drawing. The features that can be derived from the specification and the drawing may be used in other embodiments of the invention either individually or in any desired combination. In the drawing

FIGS. 8a-f show images obtained with the aid of the embodiment of the method of the invention to which FIG. 7 relates.

In the case of each of the time diagrams of the different embodiments of the method according to the invention shown in FIGS. 1, 3, 4 and 7, the triggered spin echo signals are represented along a time axis in line (a), while the rf excitation pulses are represented in line (b) and the pulsating gradient fields which in the case of the underlying method according to the invention are directed perpendicularly to each other, are represented in lines (c), (d) and (e). The gradient field represented by line (c) is directed perpendicularly to the excited, disk-shaped area (direction of the selection gradient) while the directions of the gradient fields represented by lines (d) and (e) extend in the plane of the said disk. The gradient represented by line (e) defines the reading direction (reading gradient).

Figure 1:
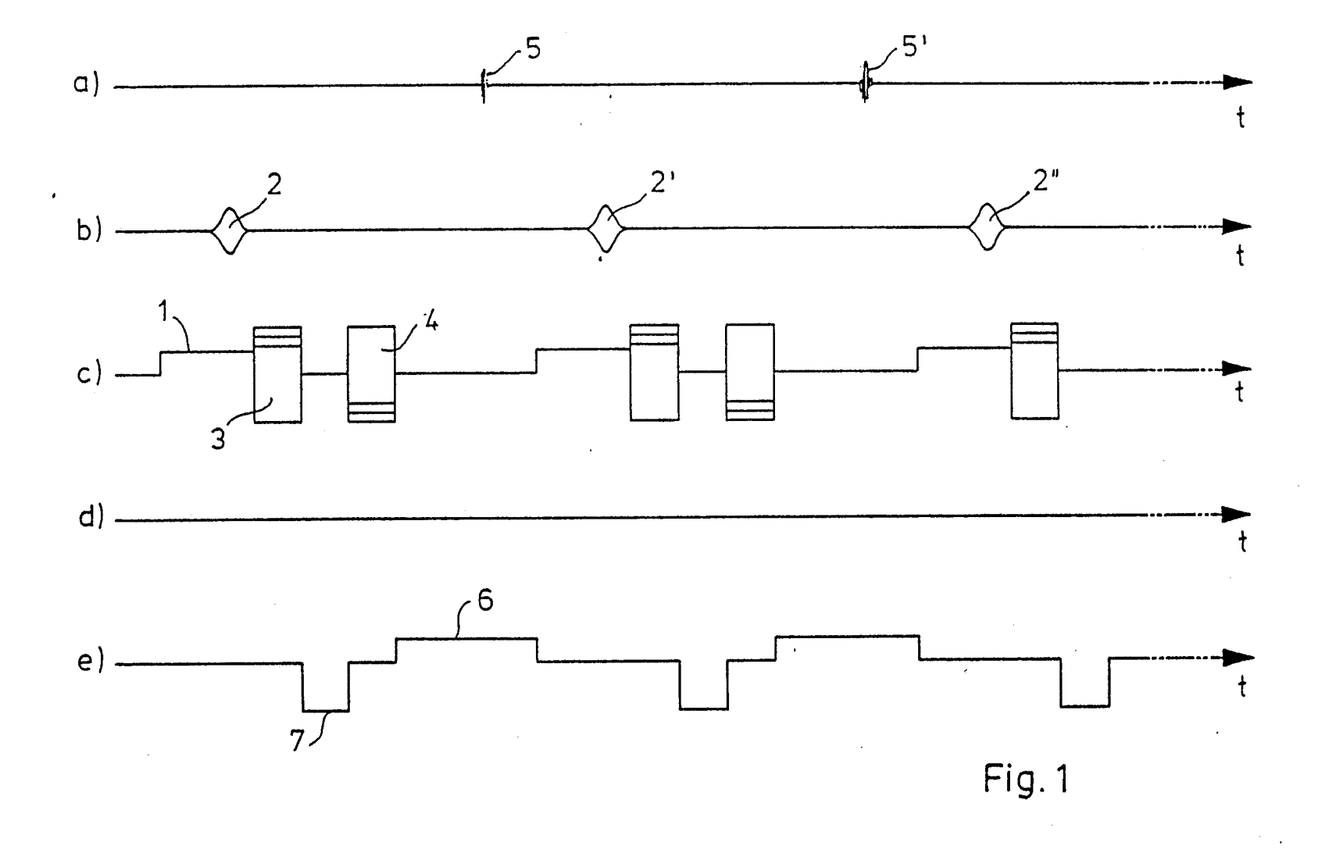
FIG. 1 shows a time diagram of a first embodiment of the method according to the invention.

In the simplest embodiment of the method according to the invention illustrated in FIG. 1, the body to be examined is exposed to a selection gradient 1 and at the same time to an rf pulse 2 so that a disk-shaped area of the body is excited which extends perpendicularly to the direction of the selection gradient 1. The position and the axial extension of this area depend on the value of the selection gradient, the carrier frequency and the shape of the rf pulse. Usually, the rf pulse 2 is a 90° pulse, although other rf pulses generating different flip angles can be employed, too.

After excitation of the disk-shaped area, the body is exposed to two components of a flow phase gradient following each other at a certain interval. The direction of this flow phase gradient is the same as the direction of the selection gradient so that these components are represented in the same line (c) of FIG. 1 as the said selection gradient 1. The components 3, 4 of the flow phase gradient are inversely identical so that their effects on the stationary material contained in the excited disk are cancelled out. If, however, material flowing in the direction of the flow phase gradient, i.e. transversely to the disk, is present in the disk, the effects which these gradient pulses have on the moving material differ due to the spatial displacement of the material during the time interval between the two components 3, 4 so that the integral across the two components 3, 4 of the flow phase gradient results in a dephased effect on the spins of the moving material whose induction signal has died out rapidly after excitation by the rf pulse 2. During presence of the spin echo signal 5, a reading gradient 6 extending in the plane of the excited disk is applied which is preceded by an oppositely directed gradient pulse 7 in the area between the components 3 and 4 of the flow phase gradient, the said gradient pulse 7, together with the reading gradient constituting an inversion scheme leading equally to the formation of a signal echo. The described measuring sequence is repeated several times, with varying flow phase gradient values, so that a plurality of spin echo signals 5, 5', etc. is obtained which are then subjected in . the usual manner to 2DFT reconstruction. Instead of the two-dimensional image which would otherwise be obtained, the method according to the invention provides an image which indicates, above the x-direction defined by the reading gradient 6, the speed v of the moving material present in those areas of the excited disk which are projected upon the x-direction of the reading gradient, as indicated by the peaks 8, 9 in FIG. 2. If there is only one point in the areas extending perpendicularly to the x-direction where the excited disk-shaped area contains moving material, the speed information provided by the peaks 8, 9 can be interpreted very clearly. In many cases it will be possible to select the x-direction of the reading gradient properly to permit such a clear interpretation.

In the case of the method just described, stationary material also furnishes a signal component due to the rephasing effect provoked by the inversion scheme formed by the gradient pulse 7 together with the reading gradient 6. This signal component can be eliminated by causing saturation of the area to be excited so that after saturation only material that has entered the saturated disk after achievement of such saturation can be excited coherently and caused to form an echo signal. Saturation of the excited disk can be achieved by causing the individual measuring sequences triggered by an rf pulse 2, 2', 2" etc. to follow each other with sufficient rapidity that complete relaxation of the previously excited spins fail to occur between any two measuring sequences. In this case, the magnetization of the selected, disk-shaped area remains in the saturated or almost saturated state during the whole measuring time, and the signal is generated substantially by the spins that entered the area under examination during the respective measuring sequence.

It may, however, happen that the individual measuring sequences cannot be released as rapidly in succession as would be required for obtaining a state of saturation throughout the whole excited area. This may be the case, for example, when pulsating material flows are to be examined so that, consequently, the rf pulses must be released in synchronism with the period of the pulsating material flow to enable the flow speed prevailing at a given point during the period of the pulsating material flow to be determined. In order to cause saturation without regard to the time interval between the rf excitation pulses, it is provided according to the embodiment of the method of the invention illustrated in FIG. 3 that following a first rf pulse 12 which is applied while the selection gradient is switched on, the latter is switched to and fro in rapid succession, as illustrated by the short pulses 20 of the selection gradient in FIG. 3. This destroys immediately the coherence of the excited spins, and the system assumes a saturated state in the area excited by the rf pulse 12. Now, when another rf pulse 22 is applied at the selection gradient 21, only that material is excited which has entered the saturated area, that has been excited once more selectively by the second rf pulse 22 in combination with the selection gradient 21, during the time interval $t_1$ between the end of the pulses 20 of the selection gradient and the application of the second rf pulse 22. Generation of the spin echo signals 25 under the effect of the components 23, 24 of the flow phase gradient and the components 26, 27 of the reading gradients is effected in the manner described above. Here again, the individual measuring sequences—the next beginning with the rf pulse 12' and the gradient pulse 20'—are carried out several times in succession with varying flow phase gradients 23, 24, as required for 2DFT reconstruction of the image according to FIG. 2. It should be noted in this connection that in the case of the embodiment of the method of the invention according to FIG. 3, additional pulses 13, 13' in the direction of the reading gradients and 14, 14' in a direction perpendicular to the selection gradient and to the reading gradient have been generated, by repeated switching, in addition to the pulse 20 in the direction of the selection gradient according to line (d).

Figure 3:
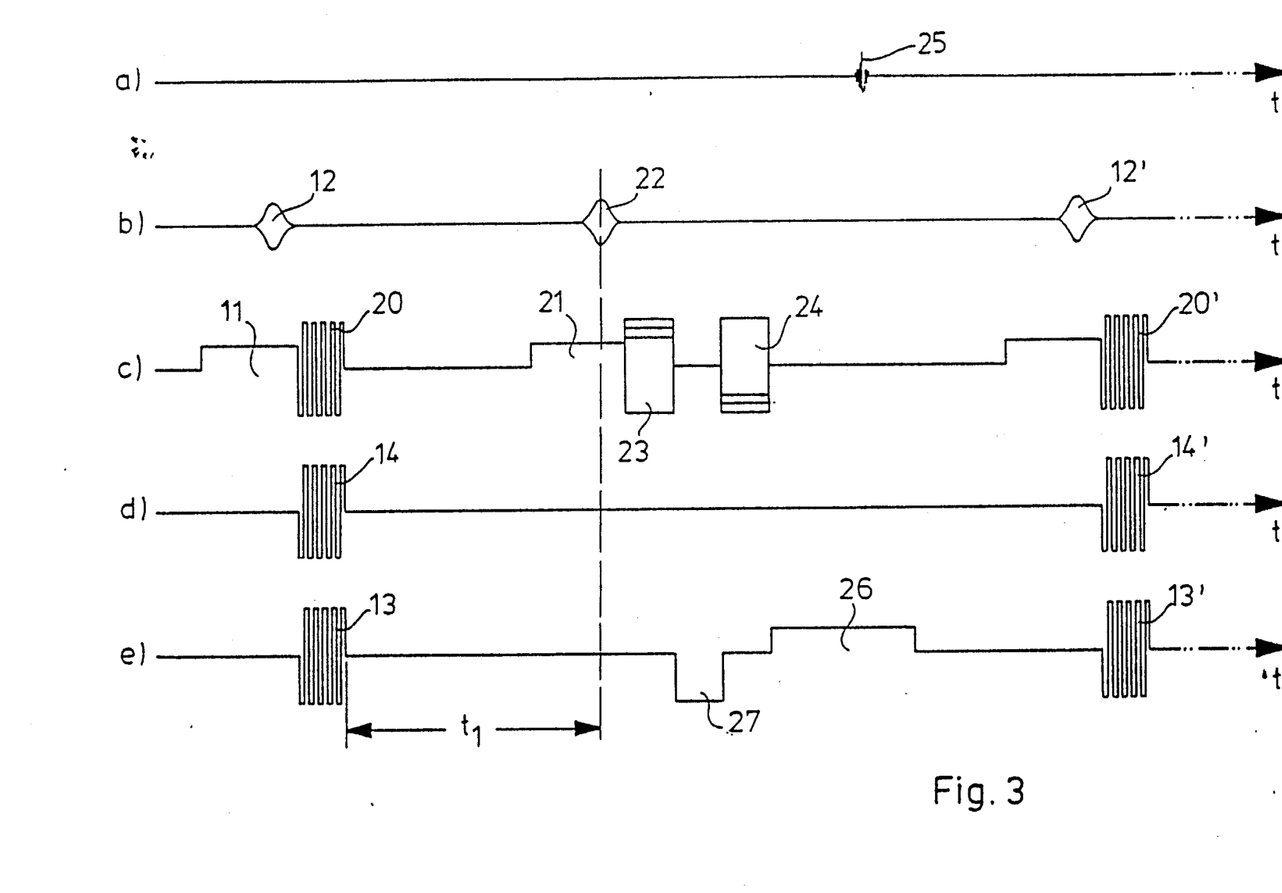
FIGS. 3 and 4 show time diagrams of other embodiments of the method according to the invention.
Figure 4:
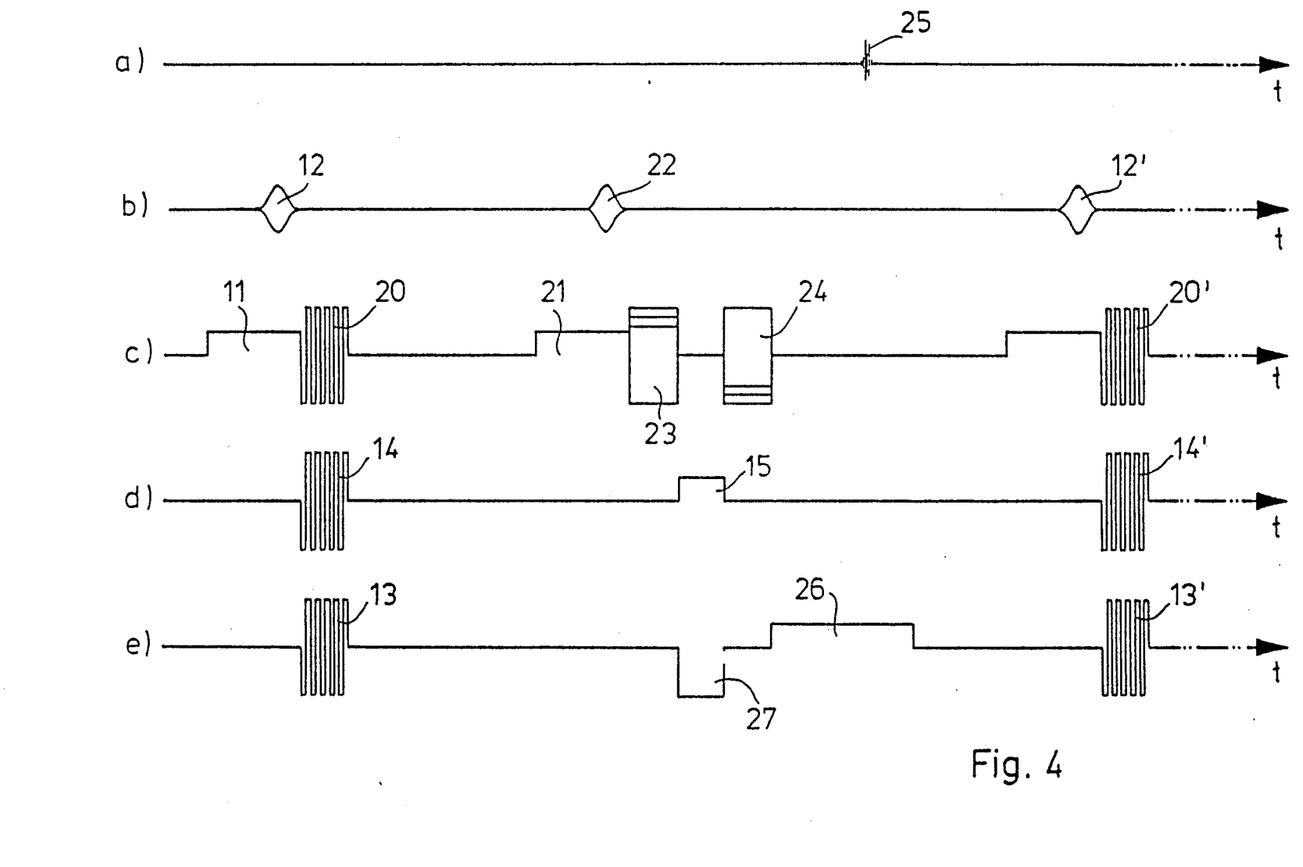

The embodiment of the invention illustrated in FIG. 4 differs from that of FIG. 3 only by the fact that another short gradient pulse 15 is applied in the plane of the selected area, in a direction perpendicular to the direction of the reading gradient 26, the said additional pulse being situated in the time interval between the two components 23, 24 of the flow phase gradient. This gradient which is switched off again before the data are recorded leads to sinusoidalal variation of the phase angle of the magnetization in the direction of this gradient. In the case of large-area structures, the signals, averaged over the direction of this gradient, are therefore extinguished while in the case of smaller structures containing moving material their signal amplitude is varied only insignificantly. This again helps achieve improved suppression of those signals which originate from stationary material.

Figure 5A:
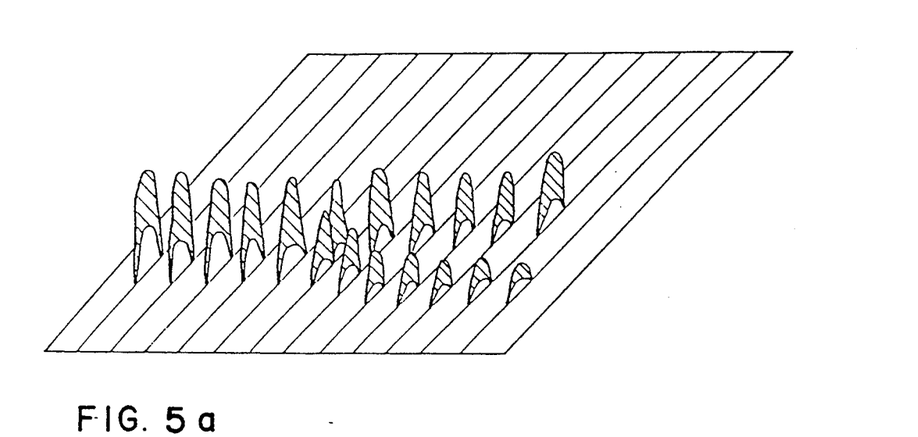
FIGS. 5 and 6 show images constructed with the aid of the method according to the invention.
Figure 5B:
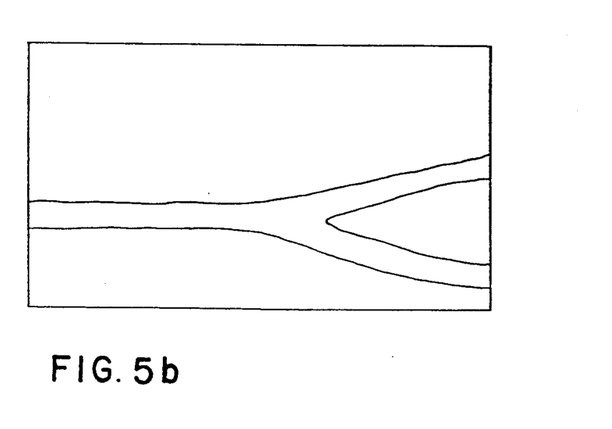

The measuring processes described above can be extended easily to a multi-layer method by recording complete data sets for several disk-shaped areas which are arranged one behind the other in the direction of the selection gradient and which are excited in succession. The pseudo 3D data so received permit projection images of a vascular tree to be derived which resemble the images obtained by x-ray angiography. From the images according to FIG. 5a which are obtained in this manner for a series of cross-sectional planes and which correspond to the images of FIG. 2, the images shown in FIG. 5b are derived by projection and/or integration over specified speed ranges.

Figure 2:
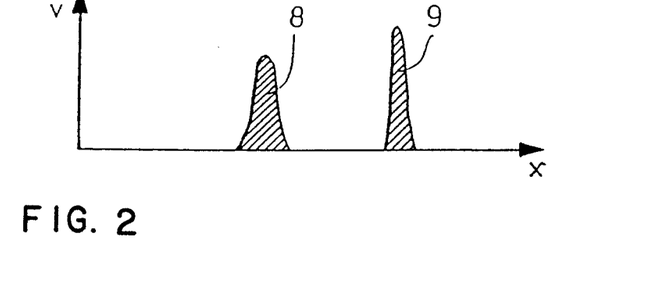
FIG. 2 is a representation of an image obtained with the aid of the method according to FIG. 1.
Figure 6:
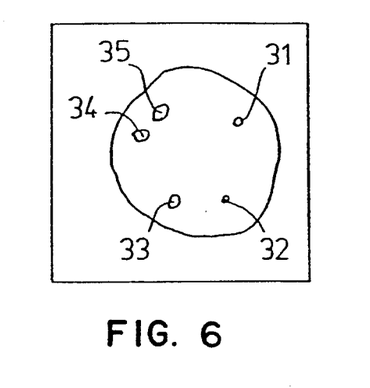

In the event the image obtained with the aid of the embodiments according to FIG. 2 does not permit to establish clear relations between the speed profiles and those points where flowing material is encountered, the method according to the invention also provides the possibility to produce a complete image of the excited disk-shaped area which permits to relate the flow profiles exactly. To this end, it is only necessary to apply again the previously described method for producing a plurality of data sets; however, this time one does not vary the selection gradient of the carrier frequency of the rf pulse by which the selected area is displaced in the direction of the selection gradient; instead, the direction of the reading gradient is varied so that a plurality of different data sets is obtained from which a two-dimensional image of the disk, in conjunction with the speed components, plotted along the third dimension, is obtained by 3DFT reconstruction. The speed components are then related to the individual points of the flowing material, for example the veins in a cross-section of a body. FIG. 6 shows such a cross-sectional image where the intensity and the size of the points 31 to 35 is characteristic of the speed of the flowing material existing at those points. Now, it is of course possible to calculate the flow speed prevailing at these points and to determine these speeds with high accuracy.

Figure 7:
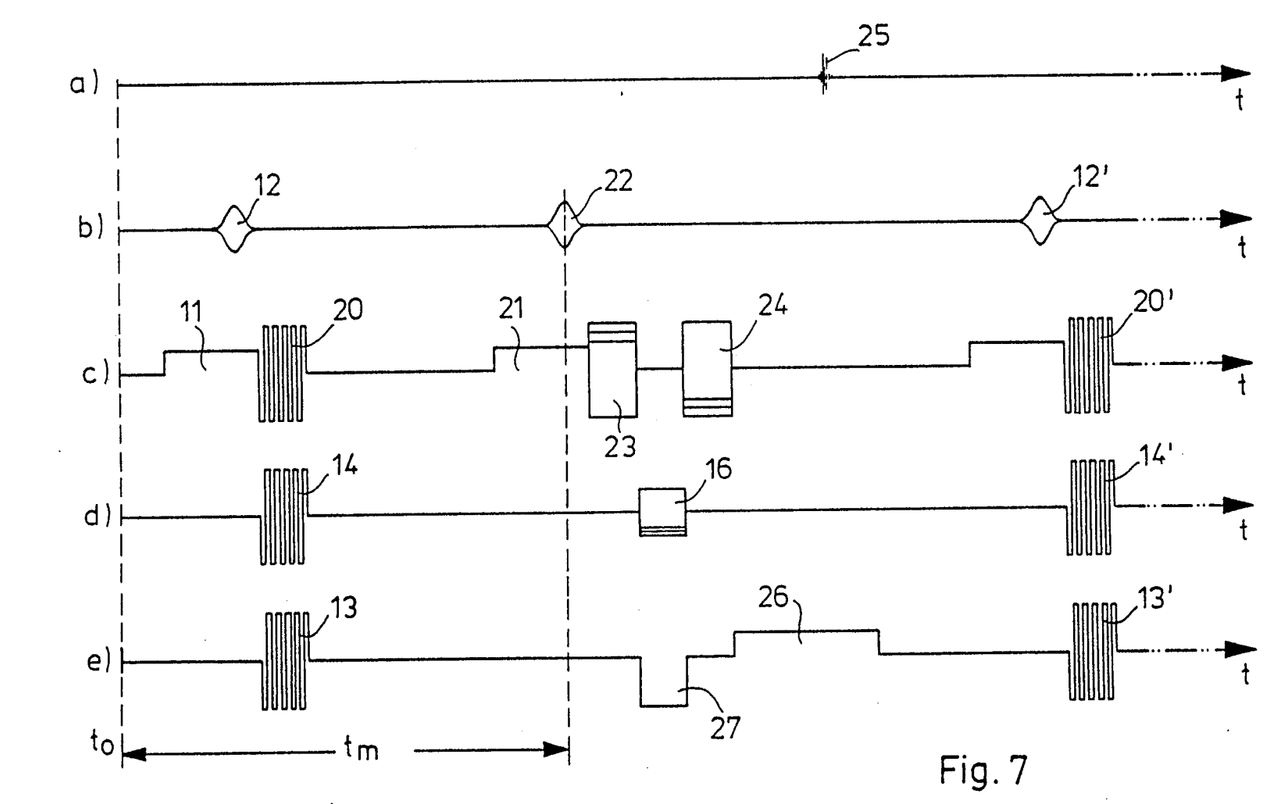
FIG. 7 shows a time diagram of another embodiment of the method according to the invention.
Figure 8A:
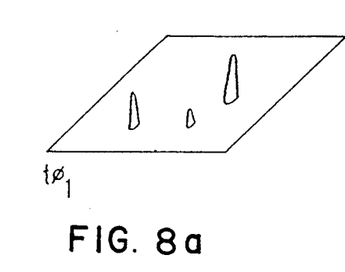
Figure 8B:
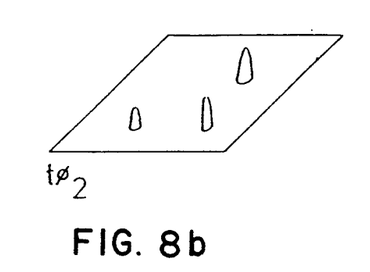
Figure 8C:
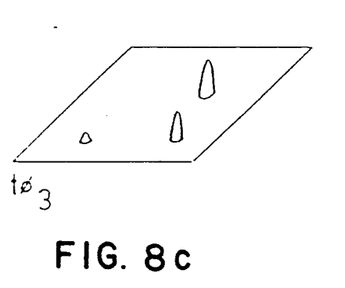
Figure 8D:
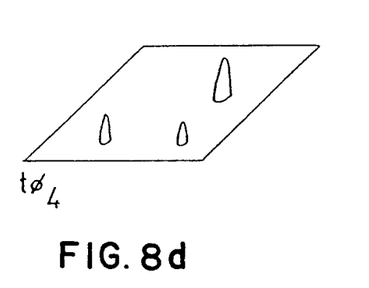
Figure 8E:
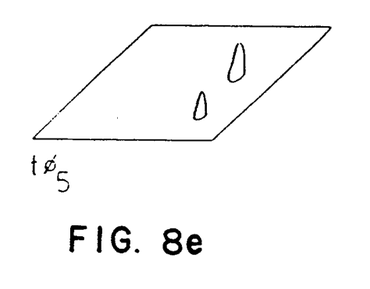
Figure 8F:
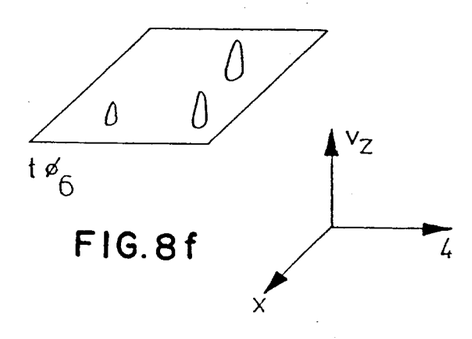

Another possibility of generating the images consists in recording a plurality of data sets with different spatial phase gradients instead of differently directed reading gradients. This variant of the method according to the invention is illustrated in FIG. 7. Instead of using a constant gradient pulse 15 along a direction perpendicular to the selection gradient and the reading gradient, as illustrated in FIG. 4, one employs in this embodiment of the invention, as a spatial phase gradient, a phase coding gradient varying within a number of successive data sets, as normally used in NMR tomography. Here again, 3DFT reconstruction leads to images representing in the one plane the excited disk-shaped area and, in a plane extending perpendicularly thereto, the speed of the material present in this area. FIGS. 8a-f depict six such images.

As mentioned before, the method according to the invention can be used not only for determining steady material flows, but also for examining pulsating material flows and for determining the speed profile of the material flow over the pulse period. This is effected by carrying our the measurement at different intervals from the beginning of the pulse period. In clinical examinations of the blood streams, the measurements can be triggered for example by an ECG signal, as indicated in FIG. 7 at the time $t_0$. The images (a) to (f) shown in FIGS. 8a-f correspond to different intervals $t_m$ between the beginning of the pulse period indicated by the ECG signal and the rf excitation pulse 22 determining the moment of the speed measurement and following the development phase determined by the first rf excitation pulse 12 and the applied gradient fields 13, 14, 20. This triggering by an ECG pulse or another signal defining the commencement of the pulse period of a pulsating material flow is possible with all the methods described heretofore. If the pulse period is sufficiently long, a plurality of measuring sequences with equal flow phase gradients can be carried out during any such period. The measuring sequences then supply signals relating to different points in time over the pulse period. It is then possible to combine to one signal set and process all the signals relating to the same point in time over the pulse period, and to establish the speed profiles over the pulse period within relatively short time. This is of particular importance when the pulse period is long relative to the duration of the individual measuring sequences, as is the case in particular with the pulsation of the human blood. It goes without saying that all variants of the method, and in particular all variants of the method described before, provide the possibility to record several measuring sequences over one pulse period for determining the speed profile of pulsating material flows.

The method according to the invention is not limited to the embodiment described above. Rather, there are many possibilities of combining the steps of the method by which the embodiments described above differ from the basic method described with reference to FIG. 1. In addition, all measures which are usual in NMR tomography and which may be necessary to obtain acceptable results can be used also in connection with the method according to the invention, including for example the measure to provide the flow phase gradient in the method according to the invention with a constant offset serving to cancel out the dephasing which was brought about during selection of the disk and which is undesirable with respect to the flowing material selected in this manner.

We claim:

1. A method for determining moving material, in particular flowing material, i a body by NMR tomography, comprising:
   (a) exposing the body to a homogeneous magnetic field;
   (b) applying to the body an rf pulse and a selection gradient sufficient to excite a disk-shaped area of said body, which disk-shaped area extends in a direction substantially perpendicular to the direction of said selection gradient;
   (c) applying thereafter a flow phase gradient in the same direction as said selection gradient, which flow phase gradient comprises two successive, inversely identical sections;
   (d) applying a gradient pulse between said inversely identical sections of said flow phase gradient in a direction substantially perpendicular to said selection gradient and extending in the plane of said disk-shaped area;
   (e) applying a reading gradient in a direction substantially perpendicular to said selection gradient and extending in the plane of said disk-shaped area, but directed oppositely to said gradient pulse, whereby a spin echo signal is generated;
   (f) repeating the steps of the measuring sequence (b) to (e), while varying the value of said flow phase gradient; and
   (g) storing the spin echo signal obtained from each measuring sequence, to form a set of such spin echo signals, and subjecting said set to Fourier transformation in two directions such that every said set provides an image that contains, in the first of the two directions, the spatial coordinate along the direction of said reading gradient and, in the second of the two directions, the flow speed of material flowing in a direction perpendicular to said disk-shaped area.

2. The method of claim 1, wherein said measuring sequence is repeated with sufficient rapidity that complete relaxation of said excited disk-shaped area fails to occur between said repetitions, resulting in the substantial saturation of said excited disk-shaped area.

3. The method of claim 1, characterized in that following the first rf pulse the body is exposed to a rapidly varying gradient field which effects at least almost complete saturation of the excited area by dephasing of the excited spins, before another rf pulse is applied for exciting moving material which has entered the previously saturated area after the first rf pulse and which then furnishes the spin echo signals.

4. The method of claim 1 adapted for examining pulsating material flows, in particular the blood stream in living bodies, which further comprises determining the period of a pulsating material flow synchronizing the application of said rf pulse to coincide with at least one chosen moment of said period.

5. The method of claim 4, wherein a plurality of measuring sequences take place, without changing said flow phase gradient, during each period of pulsating material flow, and that those spin echo signals which correspond to the measuring sequences within each period are combined to form sets of such spin echo signals for 2DFT reconstruction.

6. The method of claim 1, characterized in that after excitation of the rf pulse according to step b) the body is exposed to a spatial phase gradient in a direction substantially perpendicular to said selection gradient and differing from that of the reading gradient, the value of said spatial phase gradient being varied after each measuring sequence resulting from the variation of the flow phase gradient, and that thereafter the spin echo signals obtained are subjected to 3DFT reconstruction and processed to obtain a two-dimensional image to which the flow speeds of the moving material are related in the third dimension.

7. The method of claim 6, characterized in that said spatial phase gradient is generated in a direction substantially perpendicular to the reading gradient during the interval between the sections of the flow phase gradient.

8. The method of claim 1, characterized in that after excitation by the rf pulse according to step b), the body is subjected to a phase gradient of constant value in a direction substantially perpendicular to said selection gradient and differing from the reading gradient, which phase gradient causes dephasing and, thus, suppression of the signals of large-area contours.

9. The method of claim 8, characterized in that the phase gradient is generated in a direction substantially perpendicular to that of the reading gradient in the interval between the sections between the flow phase gradient.

10. The method of claim 1 wherein several sets of spin echo signals are generated for several parallel disks and that these sets are processed to obtain a three-dimensional representation of the flow behavior over a certain length of the body under examination.

* * * * *